United States Patent [19]

Saxe et al.

[11] Patent Number: 4,736,338

[45] Date of Patent: Apr. 5, 1988

[54] PROGRAMMABLE LOOK UP SYSTEM

[75] Inventors: Timothy Saxe, Boulder Creek; Daniel R. Perkins, Mountain View, both of Calif.

[73] Assignee: Silicon Solutions Corporation, Menlo Park, Calif.

[21] Appl. No.: 916,128

[22] Filed: Oct. 7, 1986

[51] Int. Cl.⁴ .............................................. G06F 9/44
[52] U.S. Cl. ...................................... 364/900; 364/578
[58] Field of Search ............... 364/578, 200 MS File, 364/900 MS File

[56] References Cited

U.S. PATENT DOCUMENTS

| 4,162,480 | 7/1979 | Berlekamp | 364/200 |
| 4,303,991 | 12/1981 | Moore | 364/900 |
| 4,342,093 | 7/1982 | Miyoshi | 364/578 |
| 4,370,709 | 1/1983 | Fosdick | 364/578 |
| 4,467,409 | 8/1984 | Potash et al. | 364/200 |
| 4,513,374 | 4/1985 | Hooks | 364/200 |
| 4,587,625 | 5/1986 | Marino et al. | 364/900 |
| 4,604,718 | 8/1986 | Norman et al. | 364/900 |
| 4,630,231 | 12/1986 | Hirata et al. | 364/900 |

Primary Examiner—David Y. Eng
Attorney, Agent, or Firm—Walter J. Madden, Jr.; Alan H. MacPherson

[57] ABSTRACT

A simulation technique for modeling the function of logic elements containing memory is disclosed. The technique uses a table to represent the logical function of the devices that are being simulated.

3 Claims, 2 Drawing Sheets

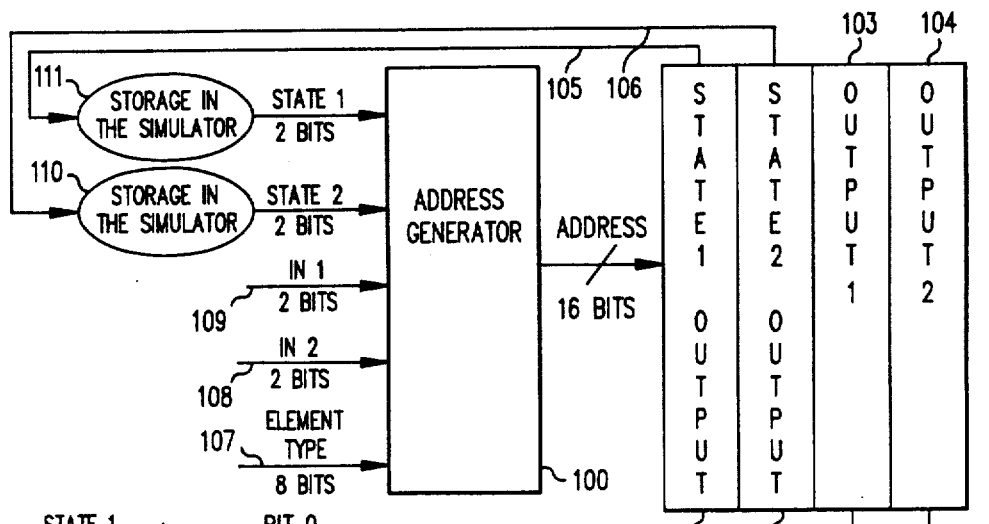
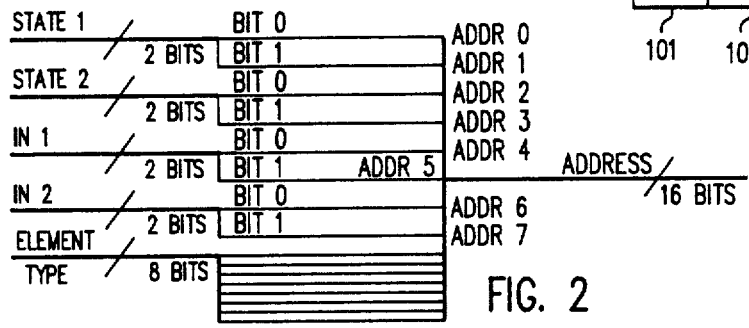
FIG. 1
FIG. 2
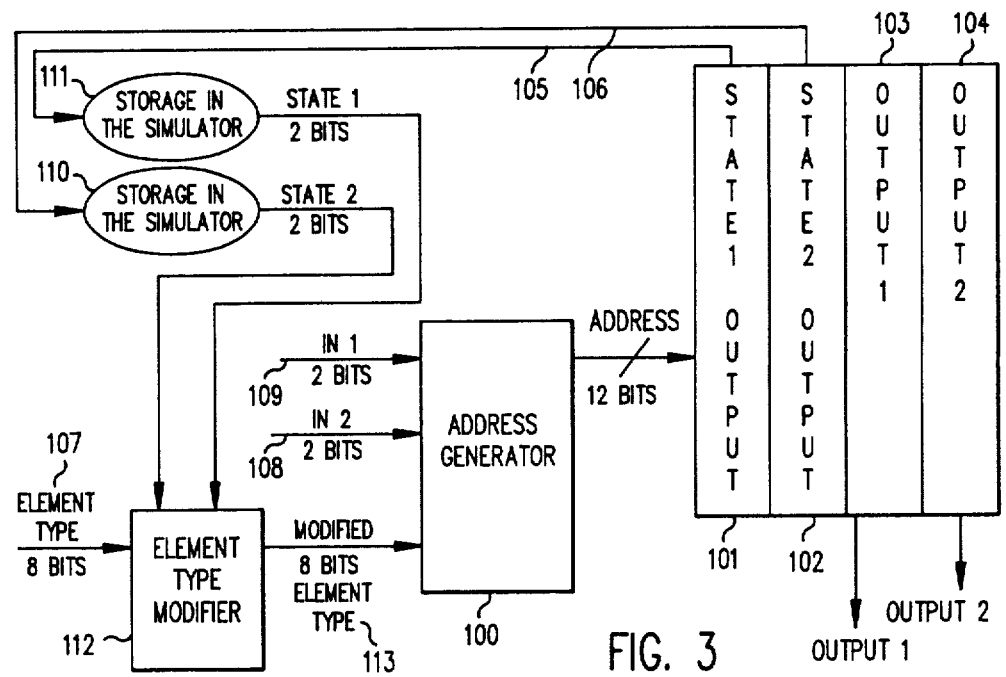
FIG. 3

PROGRAMMABLE LOOK UP SYSTEM

BACKGROUND OF THE INVENTION

1. Field of the Invention

This invention relates to modeling of logic devices which is required during logic simulation of digital designs.

2. Description of the Prior Art

Currently, either computer programs running on general-purpose computers or special-purpose computers are used to simulate the operation of digital designs. The simulation of such designs is used to test the operation of the design before the design is physically implemented as a printed circuit board or an integrated circuit. Each design is represented as a collection of interconnected logic devices. The logic simulator must evaluate the behavior of each logic device and simulate the effects of the interconnections between the devices. This invention describes a technique whereby a logic simulator can evaluate the behavior of a logic device.

For any number of reasons, there is an increasing emphasis upon the simulation of digital designs. This increase in emphasis is causing a related increase in the requirements placed upon logic simulators. There is a need for improved performance as well as improved accuracy in device modeling.

Currently, there are three classes of logic simulator: software, firmware, and hardware. Software logic simulators provide a performance of a few thousand events per second; firmware simulators, a performance of a few tens of thousand events per second; and hardware simulators, a performance of a few hundred of thousand events per second. Software simulators can typically model simple combinatorial logic elements, simple memoried logic elements, and complex memoried elements; firmware simulators can typically model simple combinatorial and memoried elements; hardware simulators can typically model only combinatorial elements.

Thus, the simulation user has a choice between speed and modeling ability. It must be noted that simple memoried elements can be constructed from combinations of combinatorial gates, and that complex memoried elements can be constructed of combinations of simple memoried elements and simple combinatorial elements. Thus, any of the classes of simulator can be used to simulate a given circuit. However, the use of multiple elements to represent a single element will result in multiple events being used to represent a single event, and thus a loss of performance. For example, whereas a software simulator might represent a JK flip-flop as a single logic element, a hardware simulator might use a combination of 9 combinatorial gates. On average, the hardware simulator will require five events to simulate the behavior of the JK flip-flop, whereas the software simulator will require only one event. Thus, the effective events per second of the hardware simulator is only 1/5th of its designed rate and consequently the hardware simulator will be only 20 times faster than the software simulator.

The need for speed is an undeniable aspect of logic simulation. A modest microprocessor built with today's technology may consist of 100,000 transistors. These 100,000 transistors can easily represent 20,000 logic elements of the sort that logic simulators process. To understand the implications of these numbers, consider the approximation that each clock cycle will produce approximately 2,000 events. Consider also the fact that it will take about 10,000,000 clock cycles to simulate just one second of operation. Thus, we can compute that to simulate one second of operation will require 20,000,000,000 events. A software simulator that processes 2,000 events per second will take 10,000,000 seconds to perform the simulation. This is a little over 155 days. A firmware simulator that processes 20,000 events per second would require 1,000,000 seconds, or 15 days. A hardware simulator that processes 200,000 events per second could finish the simulation in 27 hours.

The example of the microprocessor also highlights the value of improved device modeling. If the use of more complex device models can reduce the number of logic devices from 20,000 to 10,000, then the hardware simulator could finish the simulation overnight.

SUMMARY OF THE PRESENT INVENTION

An objective of this invention is to facilitate the use of memoried logic elements with hardware logic simulators. While the technique is pertinent to software and firmware logic simulators, it is much more useful to hardware logic simulators.

Currently, there are three basic techniques for evaluating the function of a logic element within a software simulator. The first technique is to use a subroutine in which various programming statements are used to compute the outputs from the inputs. The second technique is to use a truth table in which a matrix is used to describe each possible output as a function of the element inputs. The third technique is to use a zoom table in which a matrix is used to describe each possible output as a function of the element's type and inputs.

The desire for simplicity and speed inherent in building a hardware logic simulator forces designers to abandon the technique of a subroutine. By abandoning subroutines, hardware simulators gain speed and simplicity at the expense of a loss in generality. Instead, all hardware simulators use a zoom table. Unfortunately, zoom tables require a large memory to hold the matrix of outputs. If state (the memory in memoried logic elements) is to be included in the zoom table, it becomes even larger. Thus, even with the advances in memory capacities, zoom tables that include state are usually prohivitively large.

This invention describes the use of zoom tables to create memoried logic elements and shows how to make such zoom tables a practical size.

BRIEF DESCRIPTION OF THE DRAWINGS

FIG. 1 illustrates a zoom table of a type used in simulations.

FIG. 2 shows an address generator which can be employed in the present invention;

FIG. 3 illustrates a technique for reducing the memory requirements for a simulator;

DESCRIPTION OF THE PREFERRED EMBODIMENT

Figure 4:
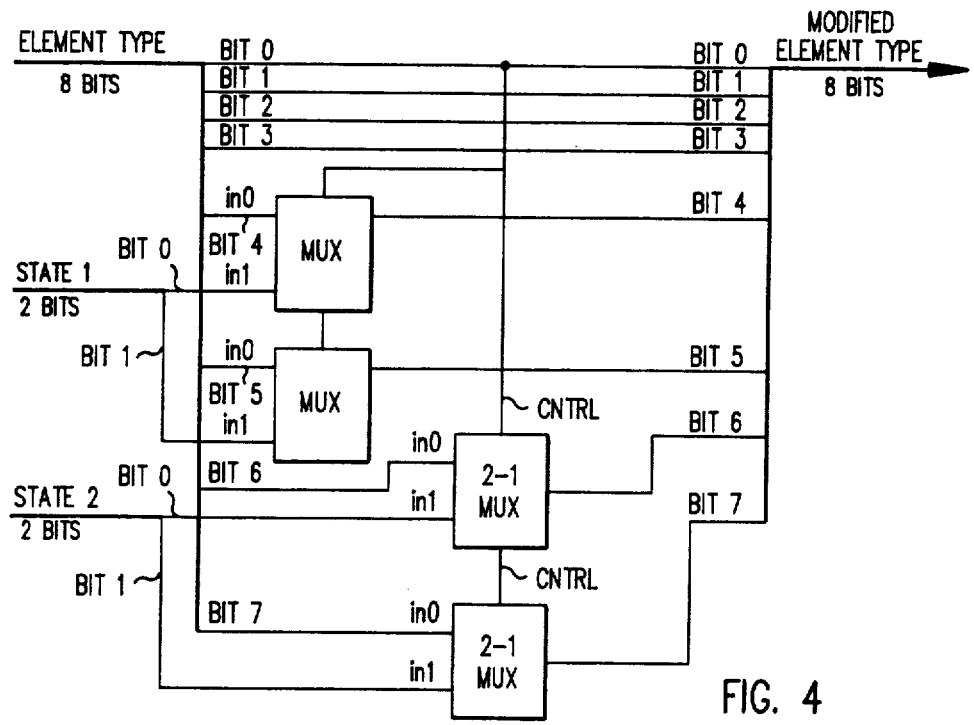
FIG. 4 shows an element type modifier useful in practicing the present invention.

Referring to FIG. 1, a zoom table according to the present invention is shown. In this particular case all logic functions are represented as having two states, two inputs and two outputs, where each state, input or output can have one of four logic levels and hence requires two bits to represent. The example allows 256 different element types and hence the element type input, 107, requires 8 bits. The state values, input values and element type are processed by an address generator whose function is to produce an address. In this particular instance the address generator is very simple, being merely a concatenation of all the signals as shown in FIG. 2. The simplicity arises from the fact that all states, inputs and the element type are dense binary encodings.

The address produced by the address generator is used to address a bank of four memories (FIG. 1) including a first state output memory 101, a second state output memory 102, a first signal output memory 103, and a second signal output memory 104. These memories, which could be arrays for a software simulator, ROM for a hardware simulator or even a RAM, are 64K bits deep by 2 bits wide in this particular embodiment. If the following logic value encoding is assumed:

| Binary Encoding | Signal Value |
| --- | --- |
| 00 | 0 |
| 01 | 1 |
| 10 | X |
| 11 | Z | and further assume that the address generator uses the following mapping of input lines to address lines:

| Address Line | Input Line |
| --- | --- |
| addr 1 | state 1, bit 1 |
| addr 2 | state 1, bit 2 |
| addr 3 | state 2, bit 1 |
| addr 4 | state 2, bit 2 |
| addr 5 | in 1, bit 1 |
| addr 6 | in 1, bit 2 |
| addr 7 | in 2, bit 1 |
| addr 8 | in 2, bit 2 |
| addr 9 | element 1 |
| addr 10 | element 2 |
| * | * |
| * | * |
| * | * |
| addr 16 | element 8 | then the first 256 locations of each array would be used to represent the function of element 1, the second 256 locations for element 2, and so forth. In particular, location 0 of each array corresponds to element type=0, state 1=0, state 2=0, in 1=0 and in 2=0. Or to put it another way, the following table can be created:

| Address | Element Type | State 1 | State 2 | In 1 | In 2 |
| --- | --- | --- | --- | --- | --- |
| 0 | 0 | 0 | 0 | 0 | 0 |
| 1 | 0 | 1 | 0 | 0 | 0 |
| 2 | 0 | X | 0 | 0 | 0 |
| 3 | 0 | Z | 0 | 0 | 0 |
| 4 | 0 | 0 | 1 | 0 | 0 |
| 5 | 0 | 1 | 1 | 0 | 0 |
| * | | | | | |
| * | | | | | |
| 8 | 0 | 0 | 0 | 1 | 0 |
| * | | | | | |
| * | | | | | |
| 256 | 1 | 0 | 0 | 0 | 0 |

Compare this table with a state transition table that is used to describe a memoried logic element. A typical transition table has the following form:

| In 1 | In 2 | State 1 | Out | New State 1 |
| --- | --- | --- | --- | --- |
| 0 | — | 0 | 0 | 0 |
| 0 | — | 1 | 1 | 1 |
| 1 | 0 | — | 0 | 0 |
| 1 | 1 | — | 1 | 1 |

It is then a simple step to transform a conventional state transition table description of a memoried element into values to be stored in the memories of the device shown in FIG. 1.

A comment on the size of the memories is in order. The embodiment shows a 2 input, 2 state input logic element, and allowed for 256 such elements. Unfortunately, even simple memoried elements such as JK flip-flops typically require 5 inputs and 3 state inputs. Thus, the scheme would require 24 address bits which translates into 20 MBytes of memory to store the 3 state outputs plus two outputs.

FIG. 2, as mentioned earlier, describes a very simple form of the address generator. In this case all logic and state values are represented as 2 bits, and the element type is represented as 8 bits. Since the encodings are all dense, the address generator simply merges all 16 lines into a single 16 bit address bus. One can imagine at least one other variant. If the logic and state values are not represented by a dense encoding, then the address generator might consist of logic circuitry that combined the various lines in such a way as to create a dense encoding of the combined signals and thereby reduce the width of the address bus below the simple sum of the number of input lines.

FIG. 3 shows a scheme to reduce the amount of memory required to store the output values and output state values. The basic structure is similar to the structure described in FIG. 1, except that a new element, an element type modifier, 112, processes element and state inputs to create a modified element type which is then fed to the address generator. Also, the address generator no longer takes as input the state inputs. In the case shown in FIG. 3, the address generator now produces only 12 bits of address in contrast to the prior requirement for 16. Thus, the total memory requirement in the implementation of FIG. 3 is 8K by 8, or 8K Bytes, as opposed to 64K by 8, or 64K Bytes in FIG. 1.

The key to the memory reduction is the elimination of the two state inputs, and this is accomplished by encoding them into the modified element type as shown in FIG. 4. FIG. 4 shows the 8 bit element type being split into its constituent signals. The top bit (MSB) is used to control four 2-1 multiplexors. These multiplexors determine the 4 least significant bits of the Modified element type. If the MSB of the element type is a 0, then the multiplexors pass the 4 least significant bits of the element type straight through, and the modified element type is just the element type. If the MSB is a 1, then the multiplexors pass the state inputs through as the 4 least significant bits of the modified element type. Using this scheme we can represent 128 combinatorial gates that do not require state and 16 gates that do allow 2 states. This contrasts to the total of 256 gates of either type that is allowed by the scheme shown in FIG. 1. Thus, the scheme shown in FIG. 3 allows a tradeoff to be made between memory size and number of memoried gate types.

If the circuit shown in FIG. 4 is modified to allow three state inputs, then a system could be built that would allow two three-state gate types and 128 non-state gate types. If the number of inputs to the address generator were increased to 5, then a total of 18 bits would suffice to support a 5-input JK flip-flop. The 2 output and 3 state output memories would then require only ⅓rd of a MByte of memory.

Figure 5:
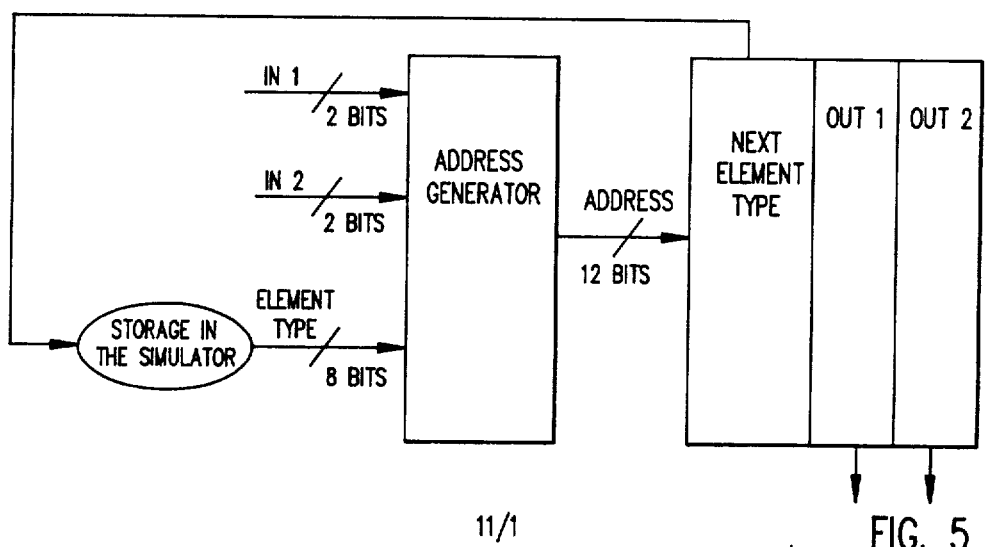
FIG. 5 shows a modification of the address generator.
Figure 6:
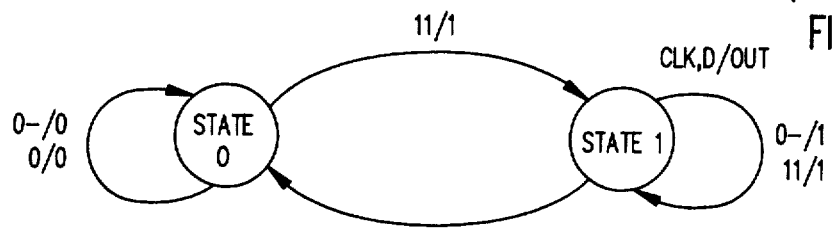
FIG. 6 is a state diagram of the operation of a D latch.

FIG. 5 shows a further refinement in which the address generator takes as inputs only the input logic values and element type, and not state values. The state output memories are replaced by a next element type memory, and the element type is modified by the simulator. This scheme can support memoried elements because the state can be encoded in the element type. This scheme may be thought of as analagous to the use of state diagrams to depict the behavior of the logic element. The element has a particular combinatorial behavior when it is in a certain state, and the inputs can also cause it to move to another state. For example consider a D latch. A state transition table would look like:

| CLK | D | State | Out | New State |
|---|---|---|---|---|
| 0 | — | 0 | 0 | 0 |
| 0 | — | 1 | 1 | 1 |
| 1 | 0 | — | 0 | 0 |
| 1 | 1 | — | 1 | 1 | whereas the state diagram would look as shown in FIG. 6. This can be converted into the following table:

| CLK | D | Type | Out | New Type |
|---|---|---|---|---|
| 0 | — | D0 | 0 | D0 |
| 0 | — | D1 | 1 | D1 |
| 1 | 0 | — | 0 | D0 |
| 1 | 1 | — | 1 | D1 |

This table can then easily be converted into programming for the output memories and the next element type memory.

The advantage of the scheme shown in FIG. 5 is that it provides maximum flexibility. First, the D latch shown in the example above requires only two element types, whereas the simple state feedback formulation of the earlier figures would require one state output, and that output would consume the equivalent of four element types. Second, this scheme does not enforce a fixed partitioning between memoried devices and combinatorial devices. Thus, the scheme shown in FIG. 5 uses less memory than the scheme of FIG. 1, and allows more different element types than the scheme of FIG. 3. To return to the example of a 5 input JK flip-flop, with the scheme of FIG. 5, the address generator would need five 2-bit inputs and the 8-bit element type. This would result in an 18 bit address that would feed three memories. The first memory would be 8 bits wide, the other 2 bits wide. Thus, the total memory requirement would be 2/5th of a MByte, but now there would be room for 240 combinatorial gates with the other 16 used to describe the JK flip-flop.

We claim:

1. A system for defining and evaluating the behavior of a memoried logic element that can be used by a logic simulator and comprising in combination:
    an address generator that takes as input a set of input values, a set of state values and an element type, and generates an address by mapping each possible combination into an address;
    one or more output value arrays or memories, each of which is addressed by the output of the address generator and holds logic values that represent the logic value of the output and where each location of an output value array holds the output value that corresponds to the set of inputs, state and element type that is mapped into that location;
    one or more state output value arrays or memories, each of which is addressed by the output of the address generator and holds state values that represent the next state that the element should assume and where each location of a state output value array holds the value of the state that the element should assume next given the set of inputs, state and element type that is mapped into that location; and
    one or more feedback paths by which the outputs of the state output value arrays or memories replace the state values stored in the element.

2. A system for defining and evaluating the behavior of a memoried logic element that can be used by a logic simulator and comprising in combination:
    an element type modifier that takes as input an element type and a set of state values and generates a modified element type by mapping combinations of element type and state into the modified element type in such a fashion that the modified element type requires no more bits to represent than the original element type required;
    an address generator that takes as input a set of input values and a modified element type, and generates an address by mapping each possible combination into an address;
    one or more output value arrays or memories, each of which is addressed by the output of the address generator and holds logic values that represent the logic value of the output and where each location of an output value array holds the output value that corresponds to the set of inputs, state and element type that is mapped into that location;
    one or more state output value arrays or memories, each of which is addressed by the output of the address generator and holds state values that represent the next state that the element should assume and where each location of a state output value array holds the value of the state that the element should assume next given the set of inputs, state and element type that is mapped into that location; and
    one or more feedback paths in the logic simulator by which the outputs of the state output value arrays or memories replace the state values associated with the element.

3. A technique for defining and evaluating the behavior of a memoried logic element that can be used by a logic simulator and comprising in combination:
    an address generator that takes as input a set of input values and an element type, and generates an address by mapping each possible combination into an address;
    one or more output value arrays or memories, each of which is addressed by the output of the address generator and holds logic values that represent the logic value of the output and where each location of an output value array holds the output value that corresponds to the set of inputs and element type that is mapped into that location;

a next element type array or memory that is addressed by the output of the address generator and holds element types, where each location of the array holds the element type that is used to represent the next element type that corresponds to the set of inputs and element type that is mapped into that location; and a feedback path in the logic simulator whereby the original element type for the element is replaced with the next element type retrieved from the next element type array.

* * * * *